US009741917B2

(12) United States Patent
Lee et al.

(10) Patent No.: US 9,741,917 B2
(45) Date of Patent: *Aug. 22, 2017

(54) THERMOELECTRIC MODULE APPARATUS

(71) Applicant: Kookmin University Industry Academy Cooperation Foundation, Seoul (KR)

(72) Inventors: Hyunjung Lee, Seoul (KR);
Yongmyeong Kim, Daegu (KR);
Hyunwoo Bark, Seoul (KR);
Woohyung Choi, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/852,694

(22) Filed: Sep. 14, 2015

(65) Prior Publication Data

US 2016/0111623 A1    Apr. 21, 2016

(30) Foreign Application Priority Data

Oct. 21, 2014 (KR) .................. 10-2014-0142839

(51) Int. Cl.
H01L 35/32 (2006.01)
H01L 35/30 (2006.01)

(52) U.S. Cl.
CPC .............. H01L 35/32 (2013.01); H01L 35/30 (2013.01)

(58) Field of Classification Search
CPC .......... H01L 35/30; H01L 35/32; H01L 35/34
See application file for complete search history.

(56) References Cited

U.S. PATENT DOCUMENTS

2013/0255739 A1* 10/2013 Kossakovski .......... H01L 35/28
136/201

FOREIGN PATENT DOCUMENTS

KR    10-1265145 B1    5/2013

* cited by examiner

Primary Examiner — Devina Pillay
Assistant Examiner — Daniel Malley, Jr.
(74) Attorney, Agent, or Firm — Paratus Law Group, PLLC

(57) ABSTRACT

Provided is a thermoelectric module apparatus including: a pipe-shaped housing having a hole that is longitudinally formed; a thermoelectric module coupled to the housing; and heat sinks combined with the thermoelectric module, in which the pipe-shaped housing has a plurality of mount holes having predetermined width and length, longitudinally extending, and arranged circumferentially in parallel with each other, the thermoelectric module has a plurality of thermoelectric plates having predetermined width, length, and thickness, the housing is connected to first sides in the width direction of the thermoelectric plates, the thermoelectric plates are disposed in the mount holes respectively with a portion in the width direction inserted and exposed inside the hole as much as a predetermined width and a portion in the width direction protruding and exposed outside the housing as much as a predetermined width, and the heat sinks are connected to the portions exposed outside the housing.

16 Claims, 12 Drawing Sheets

THERMOELECTRIC MODULE APPARATUS

CROSS-REFERENCE TO RELATED APPLICATIONS

This application claims the priority of Korean Patent Application No. 2014-0142839 filed on Oct. 21, 2014, in the Korean Intellectual Property Office, the disclosure of which is incorporated herein by reference.

BACKGROUND OF THE INVENTION

Field of the Invention

The present invention relates to a thermoelectric module apparatus, and more particularly, to a thermoelectric module apparatus that includes: a pipe-shaped housing having a hole that is longitudinally formed; a thermoelectric module coupled to the housing; and heat sinks combined with the thermoelectric module, in which the pipe-shaped housing has a plurality of mount holes having predetermined width and length, longitudinally extending, and arranged circumferentially in parallel with each other, the thermoelectric module has a plurality of thermoelectric plates having predetermined width, length, and thickness, the housing is connected to first sides in the width direction of the thermoelectric plates, the thermoelectric plates are disposed in the mount holes respectively with a portion in the width direction inserted and exposed inside the hole as much as a predetermined width and a portion in the width direction protruding and exposed outside the housing as much as a predetermined width, and the heat sinks are connected to the portions exposed outside the housing.

Description of the Related Art

An internal combustion engine generates power by burning specific fuel. In this process, a large amount of waste heat is produced, and particularly, a large amount of waste heat is included in an exhaust gas discharged through an exhaust pipe.

A thermoelectric element is a device that generates electricity, using a temperature difference, and when electricity is generated using waste heat, energy can be recycled and energy efficiency of an internal combustion engine can be improved.

However, it is an important problem to increase energy generation efficiency by increasing the temperature difference between a hot side and a cold side of thermoelectric elements.

It is very important to study high-efficiency thermoelectric active materials in the thermoelectric field. A property of a thermoelectric material, so-called figure of merit is expressed by ZT.

$$ZT = \frac{S^2\sigma}{k}T$$

In this equation, Z is figure of merit of a thermoelectric material, S is seebeck coefficient, σ is electric conductivity, k is thermal conductivity, and T is temperature. In order to achieve high figure of merit, high seebeck coefficient and electric conductivity and low thermal conductivity are required. Since the thermal conductivity follows Wiedemann-Franz law, so it is difficult to control independently from the electric conductivity, but it is possible to decrease the entire thermal conductivity by controlling the nanostructure of a material.

Since Bi2Te3 has been discovered as a thermoelectric material, the maximum ZT remains now at about 1. When ZT is larger than 2, a thermoelectric system may concur with a common technology of, for example, temperature control. The use and application of thermoelectrics depend directly on the parameter, ZT, and when a thermoelectric element is formed in a module, the following efficiency equation is obtained.

$$\eta = \frac{\Delta T}{T_h} \cdot \frac{\sqrt{1+ZT}-1}{\sqrt{1+ZT} \cdot \frac{T_c}{T_h}}$$

In this equation, ZT is a property of a thermoelectric material, $\Delta T$ is $T_h-T_c$, $T_h$ is at the temperature of a hot side, at a portion being in contact with an exhaust pipe and $T_c$ is the temperature of a cold side, at a portion attached to a heat sink.

As can seen from the equation, even if there is a difference of 1° C. or more between $T_h$ and $T_c$, a thermoelectric module generates electric energy, and the larger the difference between $T_h$ and $T_c$, the larger the efficiency. For example, for ZT=1, $\Delta T$=50° C., $T_h$=100° C., and $T_c$=50° C., $$\eta = \frac{50}{100} \cdot \frac{\sqrt{1+1}-1}{\sqrt{1+1}+\frac{50}{100}} = 0.10819 = \text{about } 10.82\%$$

Efficiency of about 10.82% is achieved, and when the number of flexible thermoelectric modules increases, more electric energy will be generated.

However, when the temperature of the hot side increases, the efficiency decreases in the equation, so it is required to increase the temperature difference between the cold side and the hot side as much as the increase in temperature of the hot side.

DOCUMENTS OF RELATED ART

Patent Document

Korean Patent No. 10-1265145

SUMMARY OF THE INVENTION

An aspect of the present invention provides a thermoelectric module apparatus that includes: a pipe-shaped housing having a hole that is longitudinally formed; a thermoelectric module coupled to the housing; and heat sinks combined with the thermoelectric module, in which the pipe-shaped housing has a plurality of mount holes having predetermined width and length, longitudinally extending, and arranged circumferentially in parallel with each other, the thermoelectric module has a plurality of thermoelectric plates having predetermined width, length, and thickness, the housing is connected to first sides in the width direction of the thermoelectric plates, the thermoelectric plates are disposed in the mount holes respectively with a portion in the width direction inserted and exposed inside the hole as much as a predetermined width and a portion in the width direction protruding and exposed outside the housing as much as a predetermined width, and the heat sinks are connected to the portions exposed outside the housing of the thermoelectric plates.

According to an aspect of the present invention, there is provided a thermoelectric module apparatus that includes: a pipe-shaped housing having a hole that is longitudinally formed; a thermoelectric module coupled to the housing; and heat sinks combined with the thermoelectric module, in which the pipe-shaped housing has a plurality of mount holes having predetermined width and length, longitudinally extending, and arranged circumferentially in parallel with each other, the thermoelectric module has a plurality of thermoelectric plates having predetermined width, length, and thickness, the housing is connected to first sides in the width direction of the thermoelectric plates, the thermoelectric plates are disposed in the mount holes respectively with a portion in the width direction inserted and exposed inside the hole as much as a predetermined width and a portion in the width direction protruding and exposed outside the housing as much as a predetermined width, and the heat sinks are connected to the portions exposed outside the housing.

Preferably, the thermoelectric plates are inserted in the mount holes of the housing and disposed radially in the diameter direction toward the center of the housing.

Preferably, the ends in the width direction, which are positioned inside the hole of the thermoelectric plates, are arranged in a predetermined cylindrical shape to be in contact with the outer side of a predetermined exhaust pipe in the hole.

Preferably, the thermoelectric plate is made of a flexible material, can bend, and has a radius of curvature of 1 mm to 10 mm.

Preferably, the heat sinks have a predetermined coupling hole and the thermoelectric plates are inserted in the coupling holes.

Preferably, the apparatus further includes coating films made of a polymer, and the coating films are inserted in the coupling holes of the heat sinks and positioned at the ends in the width direction of the thermoelectric plates outside the housing.

Preferably, the heat sinks have a plurality of ridges and corrugations.

Preferably, the apparatus further includes a plurality of connecting terminals, and the connecting terminals are disposed between the thermoelectric plates respectively and connect the thermoelectric plates in series.

Preferably, the connecting terminals extend along the outer circumference of the housing and are connected to both ends of two thermoelectric plates.

Preferably, the connecting terminals include a plurality of first connecting terminals connected to lateral both ends of the thermoelectric plates and a plurality of second connecting terminals, the first connecting terminals connect first ends of two adjacent thermoelectric plates, the second connecting terminals connect second ends of two adjacent thermoelectric plates, and the thermoelectric plates are connected in series by connecting the first connecting terminal and the second connecting terminal to both ends of any one thermoelectric plates, respectively, and connecting the first connecting terminal and the second connecting terminal to another thermoelectric plate, respectively.

Preferably, the apparatus further includes a plurality of moving terminals that change positions, and the moving terminals connect the thermoelectric plates in parallel by connecting the connecting terminals, and connect or disconnect the connecting terminals by changing positions.

Preferably, the moving terminals include a plurality of first moving terminal connected to lateral both ends of the thermoelectric plates and a plurality of second moving terminals, and the first moving terminals connect the first connecting terminals and the second moving terminals connect the second connecting terminals, so the thermoelectric plates are connected in parallel.

Preferably, the moving terminals have a parallel connection mode that connects adjacent connecting terminals and a series connection mode that disconnects adjacent connecting terminals, by moving along the outer side of the housing.

Preferably, the apparatus further includes caps coupled to both ends of the housing, in which the caps are detachably coupled to the housing.

Preferably, the caps are disposed rotatably in the circumferential direction of the housing and the moving terminals are disposed inside the caps, so when the moving terminals are moved with rotation of the caps, a parallel mode and a series mode are changed.

Preferably, the housing includes a flexible material and is developed into one plate by being laterally divided by separation lines that are longitudinally formed, and a cylindrical configuration is achieved by rolling the housing and connecting both lateral ends.

Preferably, the housing is laterally divided into two parts by two separation lines that are longitudinally formed, and one of the parts is hinged to turn and the other one is connected by a predetermined locking device to be opened/closed.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
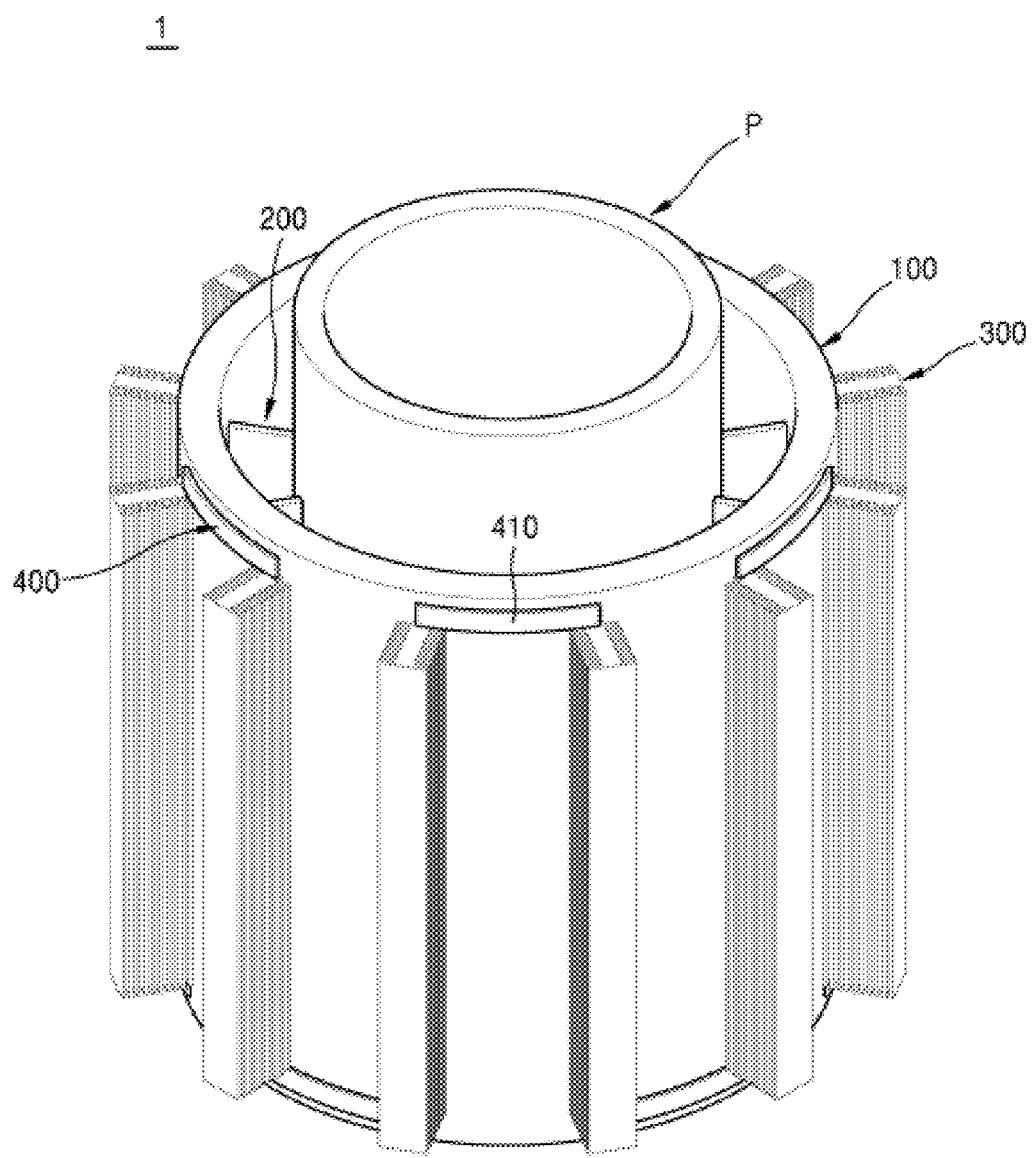
FIG. 1 is a view illustrating a thermoelectric module apparatus according to an embodiment of the present invention.

Hereinafter, exemplary embodiments of the present invention will be described with reference to accompanying drawings. The embodiments are not intended to limit the present invention.

Advantages and features of the present invention and methods for achieving them will become apparent from the descriptions of exemplary embodiments herein below with reference to the accompanying drawings. However, the present invention is not limited to the embodiments described hereafter and may be implemented in various ways, the exemplary embodiments are provided to complete the description of the present invention and let those skilled in the art completely know the scope of the present invention, and the present invention is defined by claims. Like reference numerals denote like elements throughout the descriptions.

The spatially relative terms "up", "down", "left", and "right" may be used to easily explain the relationships between one member or components and another element of components, as illustrated in the drawings. The spatially relative terms should be understood as including other directions of members being used or moved, in addition to the directions illustrated in the drawings. For example, when a member is placed transversely, the "up-down" may be construed as "left-right". Accordingly, the exemplary terms "up" and "down" may include both "left" and "right". The member may be arranged in another direction, and accordingly, the spatially relative terms may be construed in accordance with arrangement.

The terminologies used herein are provided for explaining embodiments, not limiting the present invention. Singular terms include plural terms herein, unless specifically stated. The term "comprise" and/or "comprising" used herein may include not only the stated component, step, operation and/or member, but one or more other components, steps, operations and/or members.

Unless defined in other ways, all of terminologies (including technical and scientific terminologies) used herein may be used as meaning that those skilled in the art can understand. Further, common terms defined in dictionaries should not be construed abnormally or excessively, unless specifically and clearly defined.

The thickness or size of members is exaggerated or omitted, or schematically illustrated for convenience and clearness of description. Further, the size and area of components are not the actual size or area.

Further, the angle and direction stated in the process of explaining a structure in the embodiments of the present invention are based on those in the drawings. In the description of a structure of the present invention, unless the reference point and the relationship of angles are clearly stated, refer to the relevant drawings.

Figure 2:
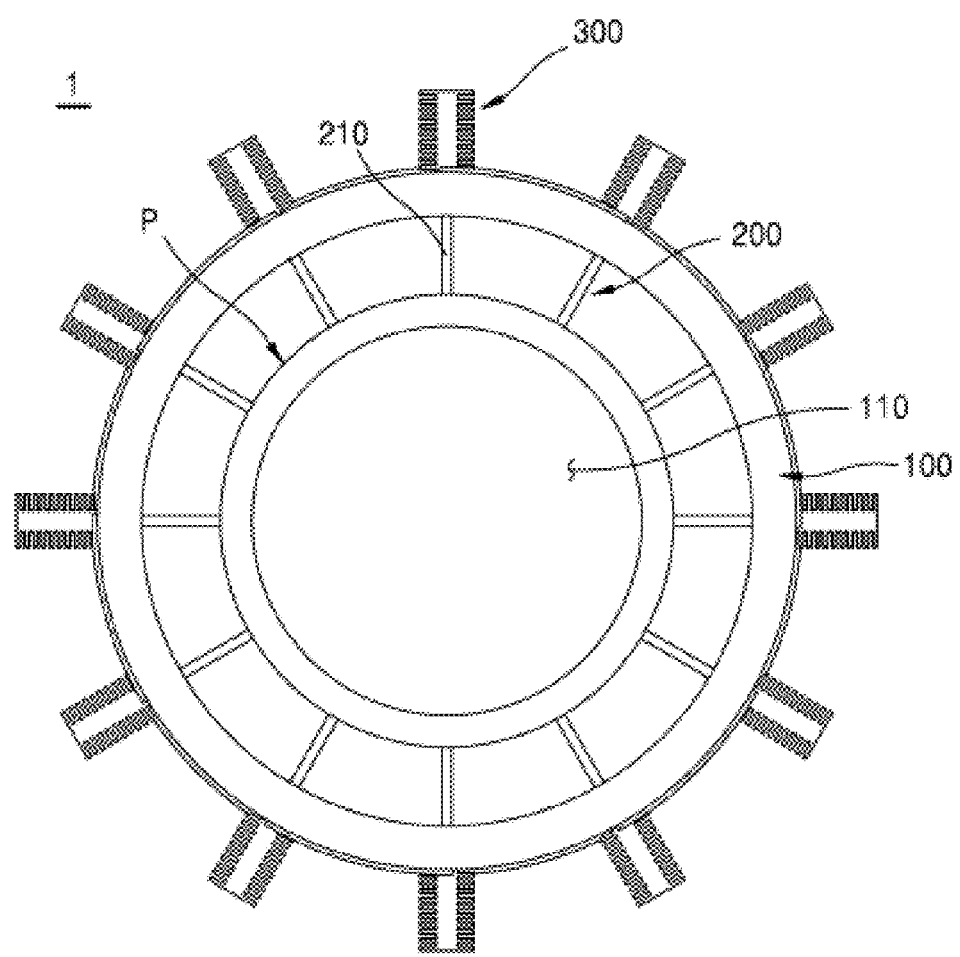
FIG. 2 is a view illustrating a thermoelectric module apparatus according to an embodiment of the present invention.
Figure 3:
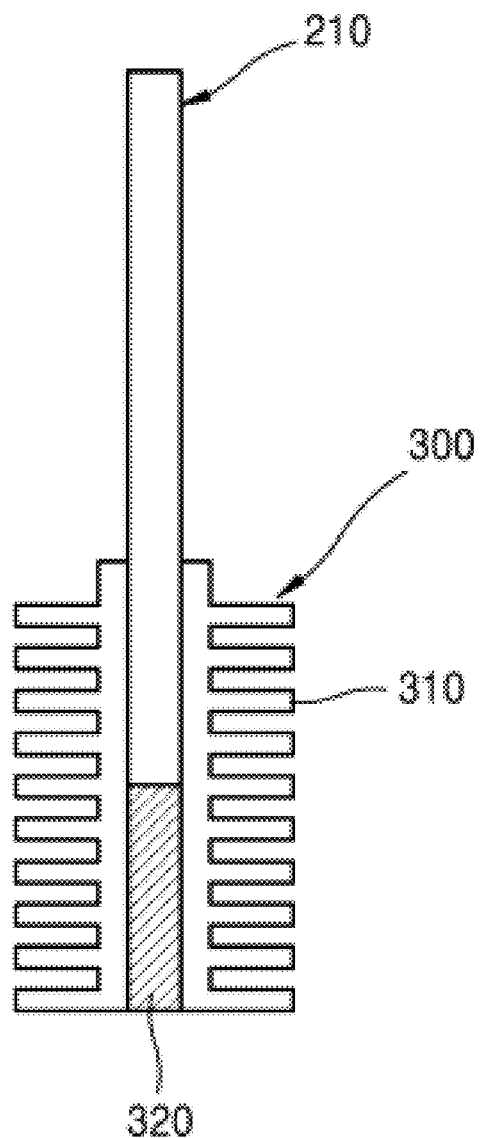
FIG. 3 is an enlarged view illustrating the coupling relationship between a thermoelectric plate and a housing of the thermoelectric module apparatus according to an embodiment of the present invention.

FIGS. 1 and 2 are views illustrating a thermoelectric module apparatus according to an embodiment of the present invention and FIG. 3 is an enlarged view illustrating the coupling relationship between a thermoelectric plate and a housing of the thermoelectric module apparatus according to an embodiment of the present invention.

In order to achieve the objects of the present invention, a thermoelectric module apparatus according to an embodiment of the present invention includes: a pipe-shaped housing 100 having a hole 110 that is longitudinally formed; a thermoelectric module 200 coupled to the housing 100; and heat sinks 300 combined with the thermoelectric module 200, in which the pipe-shaped housing 100 has a plurality of mount holes having predetermined width and length, longitudinally extending, and arranged circumferentially in parallel with each other, the thermoelectric module 200 has a plurality of thermoelectric plates 210 having predetermined width, length, and thickness, the housing 100 is connected to first sides in the width direction of the thermoelectric plates 210, the thermoelectric plates 210 are disposed in the mount holes respectively with a portion in the width direction inserted and exposed inside the hole 110 as much as a predetermined width and a portion in the width direction protruding and exposed outside the housing 100 as much as a predetermined width, and the heat sinks 300 are connected to the portions exposed outside the housing 100.

The housing 100, which is a housing of the thermoelectric module apparatus 1 according to an embodiment of the present invention and functions as a thermal medium. Preferably, the housing 100 may be made of material having high thermal conductivity. The housing 100 extends in a predetermined longitudinal direction. Preferably, the housing 100 may be made of a light or ultralight material.

The housing 100 generally has the shape of a pipe. That is, the housing 100 has the pipe-shaped cylindrical body and the hole 110 longitudinally formed through the housing 100.

The housing 100 has a plurality of mount holes (not illustrated) having predetermined width and length, longitudinally extending, and arranged circumferentially in parallel with each other. The mount holes, for example, may longitudinally extend with predetermined lengths and widths and may be arranged in parallel with each other circumferentially with predetermined gaps. The mount holes may be predetermined recesses.

The thermoelectric module 200 has a plurality of thermoelectric plates 210. The thermoelectric plates 210 are formed in the shape of a plate having predetermined length and width, that is, the shape of a predetermined plate. The thermoelectric plates 210 are arranged longitudinally in parallel with the housing 100, having predetermined length and width.

The thermoelectric plates 210 are combined with the housing 100 by being inserted in the mount holes. That is, as described above, since the thermoelectric plates 210 have the shape of a predetermined plate, they can be combined with the housing 100 by being inserted in the mount holes. That is, the thermoelectric plates 210 are inserted in the mount holes in the width direction, with portions in the width direction inside the hole 110 and other portions outside the housing 100. Accordingly, portions of the thermoelectric plates 210 are inserted and exposed as much as a predetermined width in the hole 110 and the other portions are exposed outside the housing 100 as much as a predetermined width. In accordance with this arrangement, the thermoelectric plates 210 are inserted in the mount holes of the housing 100 and disposed radially in the diameter direction toward the center of the housing 100.

On the other hand, preferably, the ends in the width direction, which are positioned inside the hole 110 of the thermoelectric plates 210, may be arranged in a predetermined cylindrical shape to be in contact with the outer side of a predetermined exhaust pipe P in the hole 110. That is, as illustrated in FIGS. 1 and 2, the size and the insertion width of the thermoelectric plates 210 are substantially uniform and the ends of the thermoelectric plates 210 in the hole 110 make a cylindrical shape, so when the predetermined cylindrical exhaust pipe P is disposed in the hole 110, the ends of the thermoelectric plates 210 can be brought in contact with the side of the exhaust pipe P.

The thermoelectric plates 210 are formed by bonding a P-type semiconductor and an N-type semiconductor and made of a material that generates electricity using a temperature difference. That is, for example, when a high-temperature hot side and a low-temperature cold side are formed at both sides in the width direction of the thermoelectric plates 210, electricity is generated in the thermoelectric plates 210.

Preferably, the thermoelectric plates 210 may be made of a flexible material to be able to bend. On the other hand, preferably, the radius of curvature when the thermoelectric plates 210 bend may be 1 mm to 10 mm. Preferably, the thermoelectric plates 210 may include, for example, a thermoelectric element coated with (for example, polyimide, poly(ether ether keton), poly(ether sulfone), and poly(phenylene sulfide) having thermal resistance by which glass temperature Tg can resist exhaust pipe temperature, and a thermoelectric material of n-type and p-type semiconductors that are used as flexible thermoelectric element may include an element coated with a heat-resistant polymer and having a radius of curvature of 1 mm to 10 mm.

On the other hand, in order to position the exhaust pipe at the center, the thickness of the thermoelectric plates 210 should not be limited such that they lose their flexibility, and the shapes of the thermoelectric plates 210 inside the housing in FIG. 2 should be straight and the shapes of the members surrounding the outside may be various, and for example, a T-shape is possible.

The heat sinks 300 coupled to the portions of the thermoelectric plates 210 which are exposed outside the housing 100.

The heat sinks 300 are disposed outside the housing 100 and coupled to the thermoelectric plates 210 exposed outside the housing 100. The heat sinks 300 may be made of an appropriate material for cooling the thermoelectric plates 210, for example, metal having high heat dissipation ability and thermal conductivity. On the other hand, the heat sinks 300 have a plurality of ridges and corrugations 310, so the exposed area is large and efficiency cooling ability can be achieved.

Preferably, the heat sinks 300 may have a predetermined coupling hole and the thermoelectric plates 210 are inserted in the coupling holes. That is, as illustrated in FIG. 3, the heat sinks 300 have a predetermined coupling hole and the coupling holes are formed to fit the ends in the width direction of the thermoelectric plates 210, so the ends in the width direction of the thermoelectric plates 210 can be inserted in the coupling holes.

Preferably, the apparatus may further include coating films 320 made of a polymer and the coating films 320 are inserted in the coupling holes of the heat sinks 300 and positioned at the ends in the width direction of the thermoelectric plates 210 outside the housing 100. Since the coating films 320 are positioned at the ends in the width direction of the thermoelectric plates 210, they can be inserted in the coupling holes of the heat sinks 300 and connected to the ends of the thermoelectric plates 210. In this case, the heat sinks 300 and the coating films 320 may be combined by a predetermined fastener such as a bolt, but it is not limited thereto.

In the thermoelectric module apparatus 1 according to an embodiment of the present invention having the configuration described above, a temperature difference between the hot side and the cold side of the thermoelectric plate 210 having the function of a thermoelectric element can spread, so the efficiency of generating energy can be improved.

A large temperature different should be maintained to increase efficiency of a thermoelectric module. To this end, other than increasing the temperature difference between the hot side and the cold side, it may be possible to prevent thermal equilibrium by the heat of the hot side transferring to the cold side by appropriately spacing the hot side and the cold side.

That is, first ends of the thermoelectric plates 210 acting as the hot side are in contact with the predetermined exhaust pipe and second ends protruding outside the housing are connected with the heat sinks 300, so the distance between the hot side and the cold side increases, and accordingly, the temperature difference between the hot side and the cold side is maximally secured and temperature gradient can be clear. Further, the coating film made of a polymer may be provided to the heat sinks 300 at the cold side, so the thermoelectric plates are elongated and the temperature difference can further spread. In addition, since the housing 100 blocks heat transfer between the hot side and the cold side, unnecessary heat transfer between the hot side and the cold side is prevented, such that a temperature difference can be maintained. Accordingly, the yield of electricity generation can be improved.

Further, in the thermoelectric module apparatus 1 according to an embodiment of the present invention, the thermoelectric plates 210 of the thermoelectric modules 200 have flexibility. Thermoelectric modules made of an alloy and ceramic in the related art have high brittleness, so they may be damaged due to external shock and vibration of an internal combustion engine, as time passes. However, since the flexible thermoelectric plates 210 are provided in the present invention, this defect is prevented, and the thermoelectric plates 210 can easily cover the exhaust pipe of an internal combustion engine, so it is possible to easily absorb external shock and vibration of the internal combustion engine. Further, for the flexible thermoelectric modules 200, carbon-based organic material having low density in comparison to alloys and ceramic are generally used due to the characteristics of the materials, so the thermoelectric modules may be relatively light.

In addition, in the thermoelectric module apparatus 1 according to an embodiment of the present invention, since the flexible thermoelectric modules 200 are inserted in the housing 100, the apparatus can be easily added to or removed from the exhaust pipes of the internal combustion engines of the related art. That is, since the thermoelectric modules 200 are flexible and an exhaust pipe can be easily inserted, they can be operated only by being installed on an exhaust pipe. Accordingly, the apparatus can be applied to all of new internal combustion engines, other than the internal combustion engines of the related art, so it can be more widely used.

Figure 4:
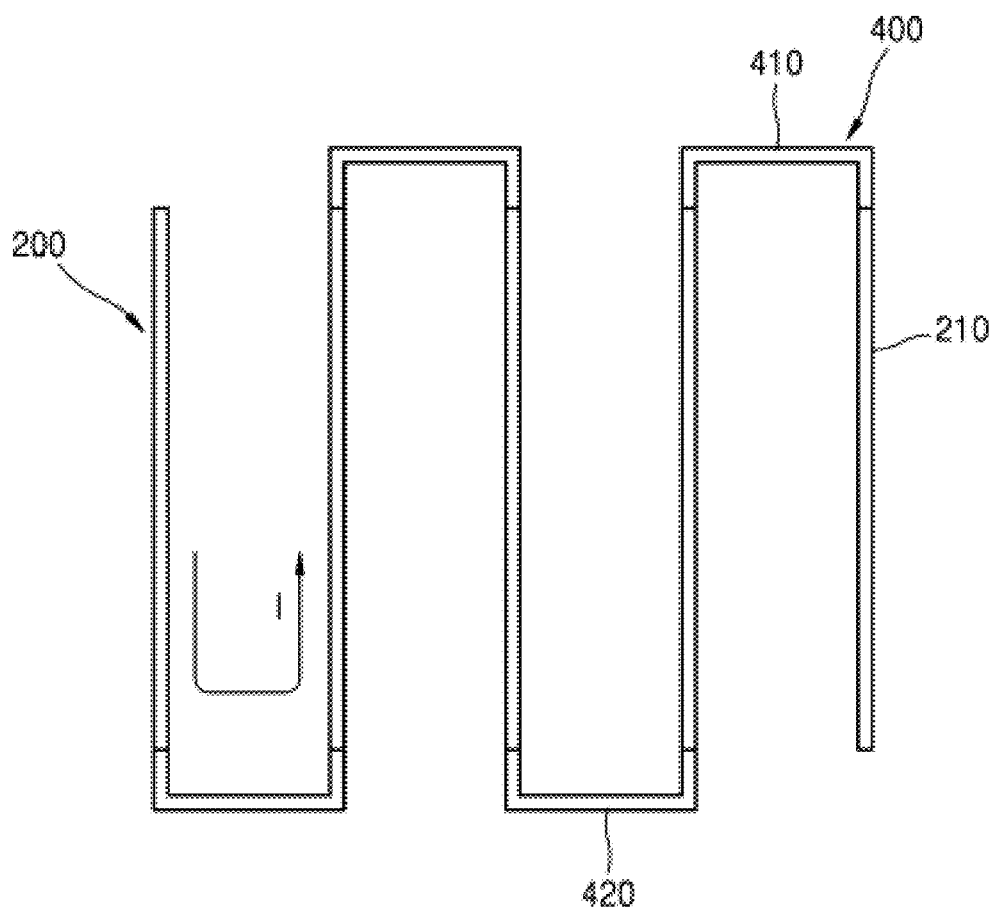
FIG. 4 is a view illustrating connection between a thermoelectric module and a connecting terminal of a thermoelectric module apparatus according to an embodiment of the present invention.
Figure 5:
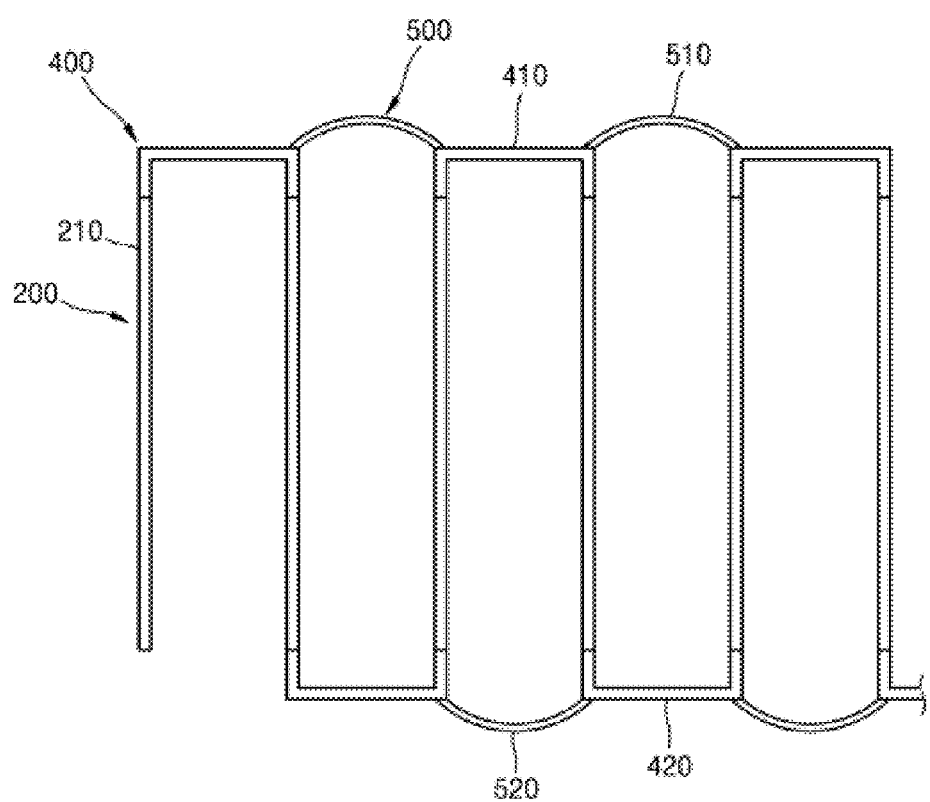
FIG. 5 is a view illustrating connection between a thermoelectric module, a connecting terminal and a moving terminal of a thermoelectric module apparatus according to an embodiment of the present invention.
Figure 6:
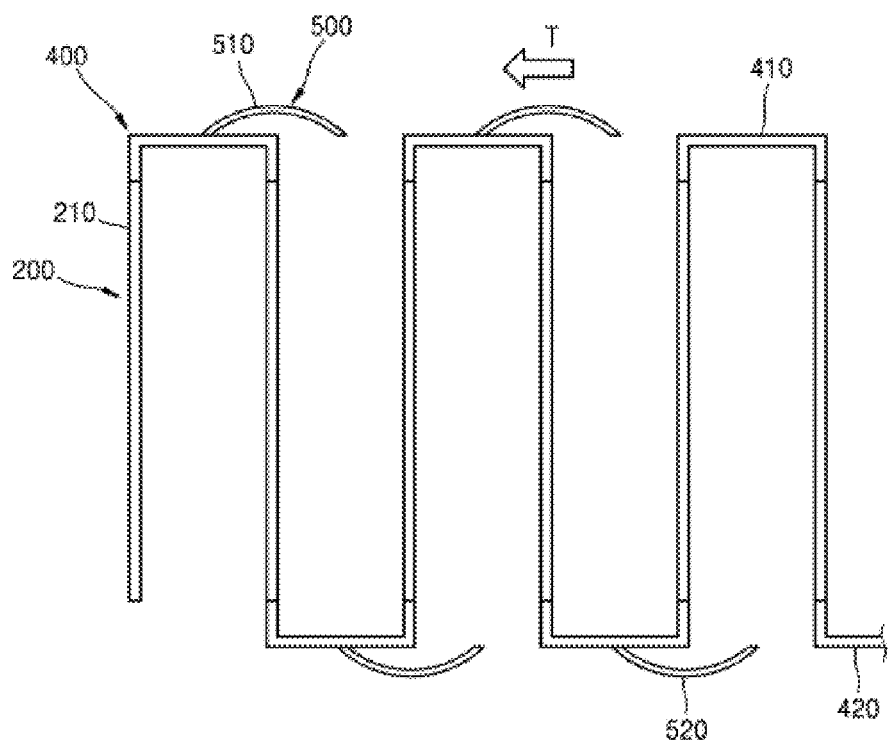
FIG. 6 is a view illustrating connection between a thermoelectric module, a connecting terminal and a moving terminal of a thermoelectric module apparatus according to an embodiment of the present invention.
Figure 7:
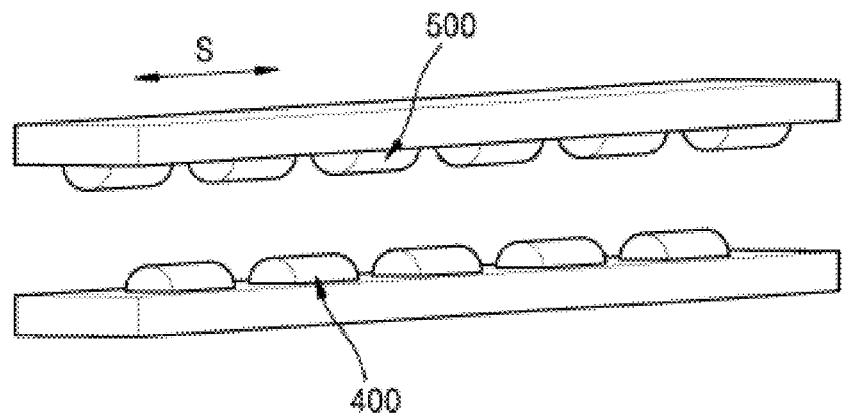
FIG. 7 is a view illustrating connection between a connecting terminal and a moving terminal of a thermoelectric module apparatus according to an embodiment of the present invention.

FIG. 4 is a view illustrating connection between a thermoelectric module and a connecting terminal of a thermoelectric module apparatus according to an embodiment of the present invention, FIGS. 5 and 6 are views illustrating connection between a thermoelectric module, a connecting terminal and a moving terminal of a thermoelectric module apparatus according to an embodiment of the present invention, and FIG. 7 is a view illustrating connection between a connecting terminal and a moving terminal of a thermoelectric module apparatus according to an embodiment of the present invention.

Preferably, the thermoelectric module apparatus 1 according to an embodiment of the present invention may further include a plurality of connecting terminals 400, in which the connecting terminals 400 are disposed between the thermoelectric plates 210 respectively and connect the thermoelectric plates 210 in series.

That is, as illustrated in FIG. 4, predetermined connecting terminals 400 are provided, disposed between the thermoelectric plates 210, and connect the thermoelectric plates 210 in series. That is, sequential connection of thermoelectric plate 210-connecting terminal 400-thermoelectric plate 210-connecting terminal 400 can be achieved.

In this case, preferably, each connecting terminals 400 may extend along the outer circumference of the housing 100 and may be connected to both ends of the thermoelectric plates 210.

Preferably, as illustrated in FIG. 4, the connecting terminals 400 may include a plurality of first connecting terminals 410 connected to both longitudinal ends of the thermoelectric plates 210 and a plurality of second connecting terminals 420. The first connecting terminals 1410 connect first ends of two adjacent thermoelectric plates 210 and the second connecting terminal 420 connect second ends of two adjacent thermoelectric plates 210, so the first connecting terminal 410 and the second connecting terminal 420 are connected to both ends of any one thermoelectric plate 210 and are each connected to another thermoelectric plate 210, and accordingly, the thermoelectric plates 210 can be connected in series. Herein, the longitudinal direction, as described above, means the forming direction of the hole 110 and the extension direction of the housing 100. According to this configuration, a current can flow in the direction I in FIG. 4.

As described above, since the thermoelectric plates 210 are connected in series by the connecting terminals 400, high yield of power can be achieved. On the other hand, in this case, predetermined electric input terminal and output terminal may be provided, but the present invention is not limited thereto.

FIGS. 5 and 6 are view illustrating connection between thermoelectric module 200, moving terminals 500, connecting terminals 400 in a thermoelectric module apparatus 1 according to an embodiment of the present invention and FIG. 7 is a view illustrating connection between connecting terminals 400 and moving terminals 500 in a thermoelectric module apparatus 1 according to an embodiment of the present invention.

Preferably, the thermoelectric module apparatus 1 according to an embodiment of the present invention may further include a plurality of moving terminals 500 that change positions. The moving terminals 500 connect the thermoelectric plates 210 in parallel by connecting the connecting terminals 400, but they can change the positions, so they can connect or disconnect the connecting terminals 400.

The moving terminals 500 connect the connecting terminals 400. Accordingly, as illustrated in FIG. 7, the thermoelectric plates 210 can be connected in parallel.

Preferably, the moving terminals 500 may include a plurality of first moving terminals 510 connected to both ends of the thermoelectric plates 210 and a plurality of second moving terminals 520. The first moving terminals 510 connect the first connecting terminals 410 and the second moving terminals 520 connect the second connecting terminals 420, so the thermoelectric plates 210 are connected in parallel.

In this case, the moving terminals 500 can connect or disconnect the connecting terminals 400 by moving in a predetermined direction of an arrow T, as illustrated in FIGS. 5 and 6. Accordingly, when the moving terminals 500 and the connecting terminals 400 are connected, a parallel connection mode of the thermoelectric plates 210 is achieved, and when the moving terminals 500 and the connecting terminals 400 are disconnected, a series connection mode of the thermoelectric plates 210 is achieved. That is, as illustrated in FIG. 7, a plurality of moving terminals 500 and a plurality of connecting terminals 400 are provided, and the moving terminals 500 can connect or disconnect the connecting terminals 400 by changing the positions in the direction of an arrow S.

Preferably, the moving terminals 500 may provide a parallel connection mode that connects adjacent connecting terminals and a series connection mode that disconnects adjacent connecting terminals 400, by moving along the outer side of the housing 100. That is, the connecting terminals 400 and the moving terminals 500 are disposed along the outer side of the housing 100 and the moving terminals 500 can connect or disconnect the connecting terminals 400 by moving along the outer side of the housing 100.

According to this configuration, the thermoelectric modules 200 can be selectively connected in parallel and in series. That is, series connection can provide high power, while parallel connection can continuously generate and supply power even if the thermoelectric plates 210 and the thermoelectric modules 200 are partially damaged.

Figure 8:
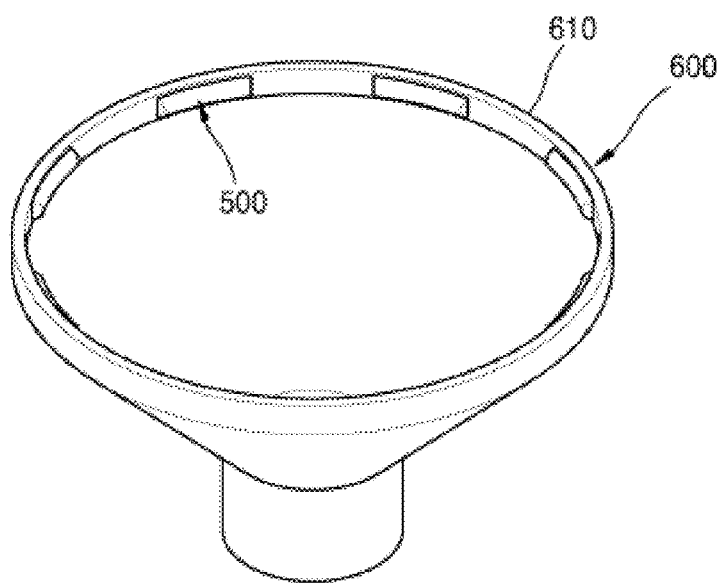
FIG. 8 is a view illustrating a cap of a thermoelectric module apparatus according to an embodiment of the present invention.
Figure 9:
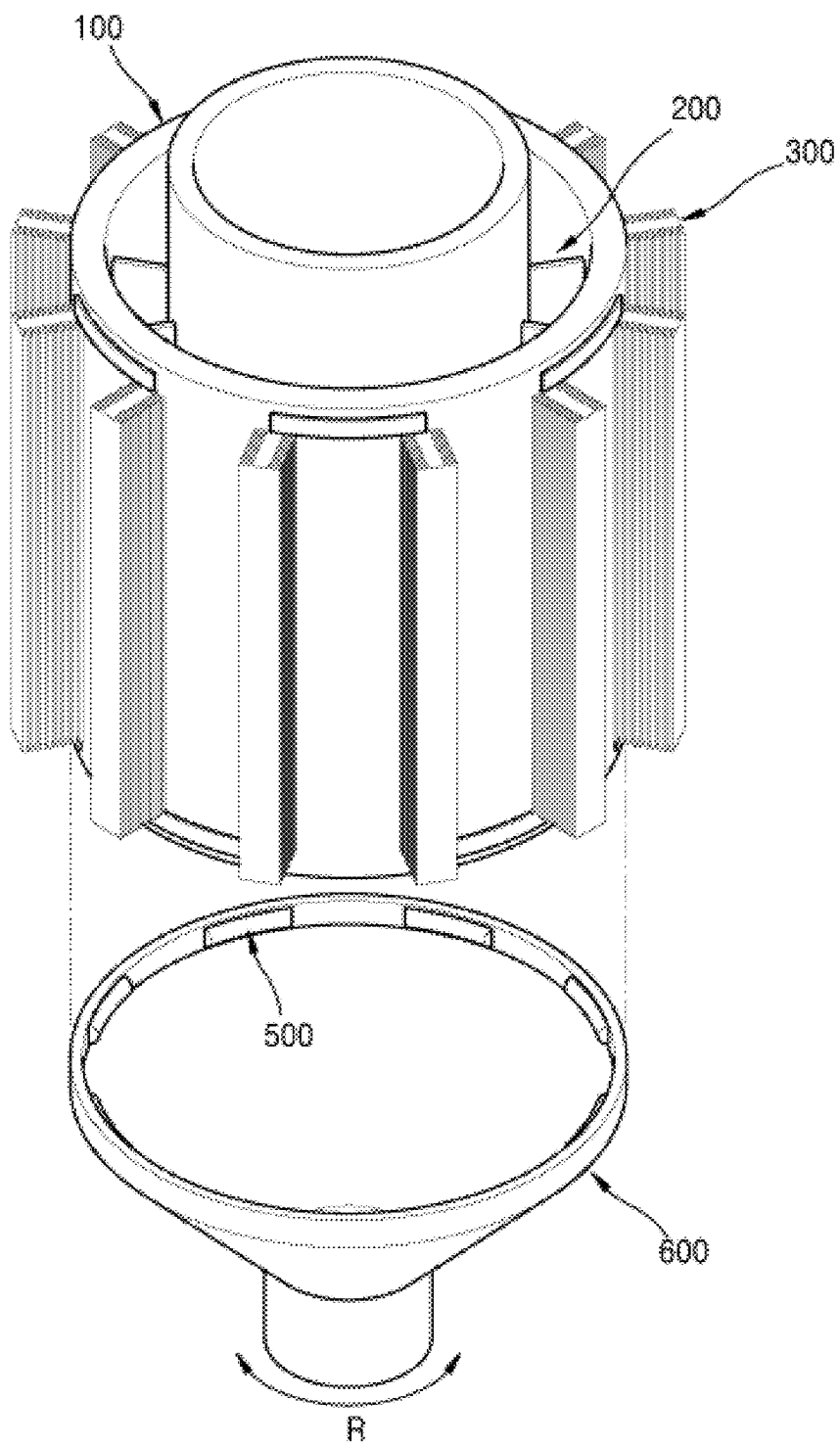
FIG. 9 is a view illustrating connection between the cap and the housing of a thermoelectric module device according to an embodiment of the present invention.

FIG. 8 is a view illustrating a cap 600 of a thermoelectric module apparatus 1 according to an embodiment of the present invention and FIG. 9 is a view illustrating connection between the cap 600 and the housing 100 of the thermoelectric module apparatus 1 according to an embodiment of the present invention.

Preferably, the thermoelectric module apparatus 1 according to an embodiment of the present invention may further include caps 600 coupled to both ends of the housing 100 and the caps 600 are detachably attached to the housing 100.

The caps 600, which are disposed at both ends of the housing 100, may be predetermined rubber caps. Preferably, the caps 600 may have a coupling portion formed in a predetermined ring shape corresponding to the longitudinal ends of the housing 100.

On the other hand, the caps 600 may be made of various materials such as rubber and metal and is not limited to these materials. The caps 600 may have rigidity that can resist vibration of an exhaust pipe or vibration of a machine and they can be brought in direct contact with an exhaust pipe, so they may be made of heat-resistant materials. Further, the caps 600 can support the thermoelectric plates 210 of the thermoelectric modules 200 covering an exhaust pipe. Further, this configuration is also not limited to that illustrated in the figures.

Preferably, the cap 600 can be turned in the circumferential direction of the housing 100 and the moving terminals 500 are disposed inside the cap 600, so when the cap 600 is turned, the moving terminals 500 move and change the parallel mode and the series mode.

That is, as described above, electric connection of the connecting terminals 400 is determined by the moving terminals 500 moving with respect to the connecting terminals 400 and the moving terminals 500 are disposed inside the cap 600 and move with turning of the cap 600, so connection between the connecting terminals 400 is determined. In this case, the cap 600 is turned in the direction of an arrow R in FIG. 9, and accordingly, the moving terminals 500 can move and connect the connecting terminals 400.

According to this configuration, the parallel connection mode and the series connection mode can be simply changed, so efficiency of generating power can be improved.

Figure 10:
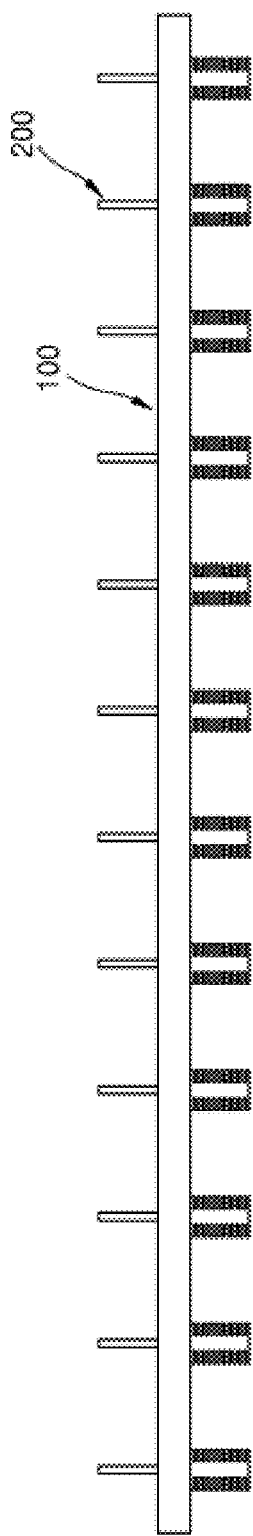
FIG. 10 is a development view illustrating a thermoelectric module apparatus according to an embodiment of the present invention.
Figure 11:
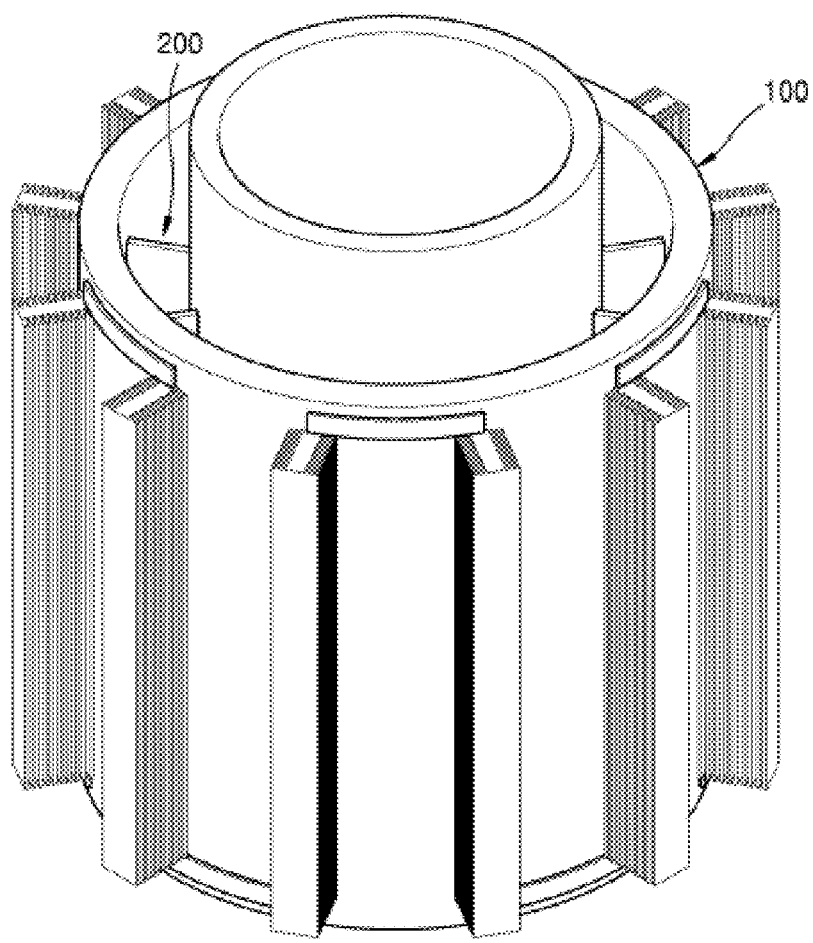
FIG. 11 is a view illustrating a thermoelectric module apparatus according to an embodiment of the present invention.
Figure 12:
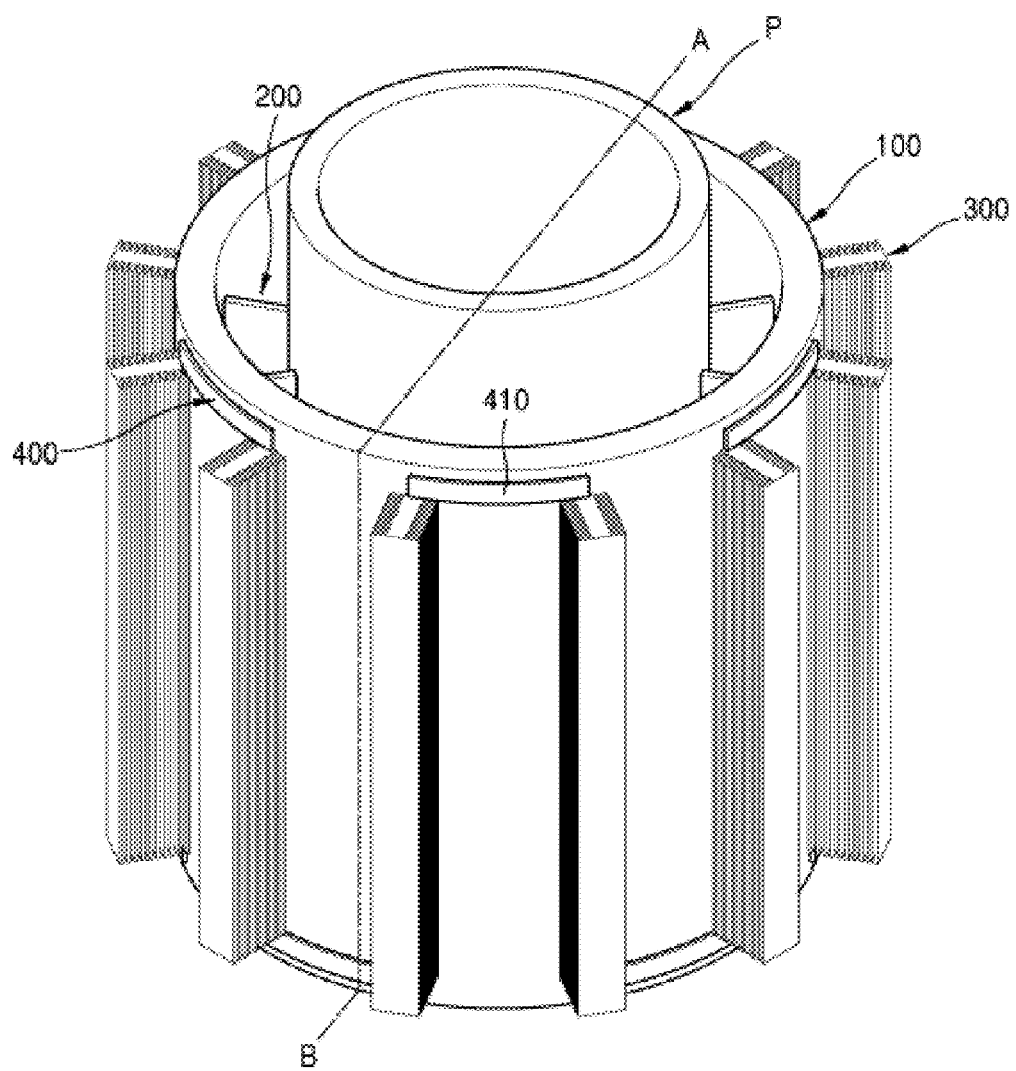
FIG. 12 is a view illustrating the structure of a thermoelectric module apparatus according to an embodiment of the present invention.
Figure 13:
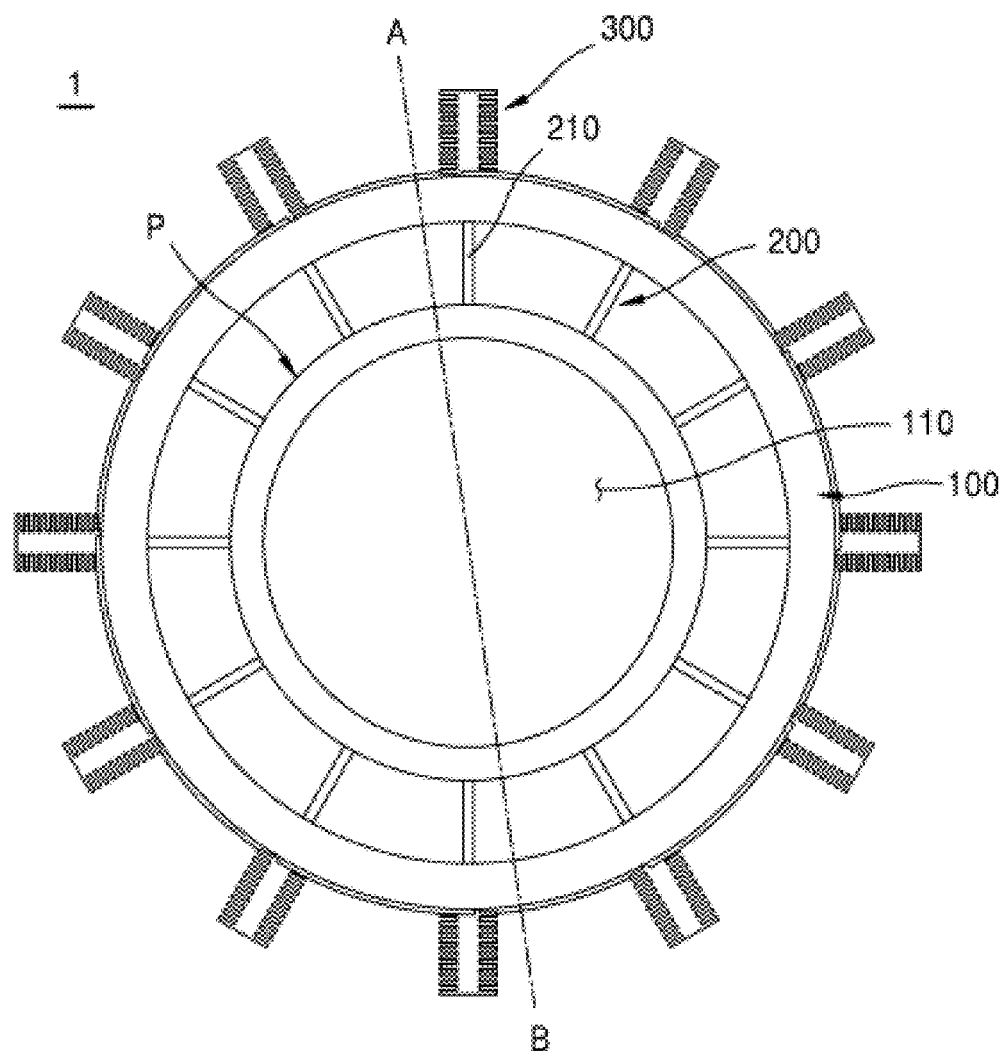
FIG. 13 is a view illustrating the structure of a thermoelectric module apparatus according to an embodiment of the present invention.

FIG. 10 is a development view illustrating the thermoelectric module apparatus 1 according to an embodiment of the present invention and FIG. 11 is a view illustrating the thermoelectric module apparatus 1 according to an embodiment of the present invention illustrated in FIG. 10. FIGS. 12 and 13 are views illustrating the structure of the thermoelectric module apparatus 1 according to an embodiment of the present invention.

The housing 100 of the thermoelectric module apparatus 1 according to an embodiment of the present invention illustrated in FIG. 10 may be made of a flexible material. On the other hand, the housing 100 may be laterally divided by separation lines that are longitudinally formed and developed in one plate, and the cylindrical housing 100 and the cylindrical thermoelectric module apparatus 1 can be achieved, as illustrated in FIG. 11, by rolling the housing and connecting the lateral ends. That is, the housing 100 has a configuration of one plate and flexibility, so a cylindrical configuration is achieved by rolling the housing and connecting the lateral ends. In this case, the thermoelectric plates 200 coupled to the housing 100 may be arranged diagonally with respect to the area direction of the housing 100. On the other hand, predetermined coupling members may be provided to connect both lateral ends of the housing 100 and the coupling members may be, for example, locking devices such as clips or hooks. According to this configuration, the apparatus can be easily mounted on a predetermined pipe. That is, the housing 100 can be simply installed by developing the housing 100 outside a pipe, rolling the housing 100 around the pipe, and then coupling the ends.

FIGS. 12 and 13 are views illustrating the structure of the thermoelectric module apparatus 1 according to an embodiment of the present invention. Referring to FIGS. 12 and 13, the housing 100 of the thermoelectric module apparatus 1 according to an embodiment of the present invention can be divided along the dashed line A-B. The housing can be divided into two half cylinders along the line A-B. Accordingly, two longitudinal separation lines can be provided. In this case, one of the divided parts is a connecting part and may be provided with a connecting device such as a hinge for rotatably connecting the two parts, and the other one is an open part and may be provided with a predetermined locking device for fixing the divided parts. Accordingly, the housing 100 can be opened/closed by turning around one part.

According to this configuration, it can be easily mounted on a predetermined pipe. That is, it can be simply mounted on a pipe by opening the open part, placing a pipe inside the open part, and closing and fixing the open part.

As set forth above, according to the thermoelectric module apparatus of the present invention, the temperature difference between the hot side and the cold side formed by thermoelectric plates having the function of a thermoelectric element, so efficiency of generating energy can be improved.

A large temperature different should be maintained to increase efficiency of a thermoelectric module. To this end, other than increasing the temperature difference between the hot side and the cold side, it may be possible to prevent thermal equilibrium by the heat of the hot side transferring to the cold side by appropriately spacing the hot side and the cold side.

On the other hand, the space where the thermoelectric plates are disposed may contain air, or may be under low pressure or under a vacuum state, so the temperature gradient at both ends of the thermoelectric plates is clear and efficiency of generating power can be improved.

That is, first ends of the thermoelectric plate acting as the hot side are in contact with the predetermined exhaust pipe and second ends protruding outside the housing and are connected with the heat sink, so the distance between the hot side and the cold side increases, and accordingly, the temperature difference between the hot side and the cold side is maximally secured and temperature gradient can be clear. Further, the coating film made of a polymer may be provided to the heat sinks at the cold side, so the thermoelectric plates are elongated and the temperature difference can further spread. In addition, since the housing blocks heat transfer between the hot side and the cold side, unnecessary heat transfer between the hot side and the cold side is prevented, such that a temperature difference can be maintained and the yield of electricity generation can be improved.

Further, according to the thermoelectric module apparatus of the present invention, the thermoelectric plates of the thermoelectric modules have flexibility. Thermoelectric modules made of an alloy and ceramic in the related art have high brittleness, so they may be damaged due to external shock and vibration of an internal combustion engine, as time passes. However, since the flexible thermoelectric plates are provided in the present invention, this defect is prevented, and the thermoelectric plates can easily cover the exhaust pipe of an internal combustion engine, so it is possible to easily absorb external shock and vibration of the internal combustion engine. Further, for the flexible thermoelectric modules, carbon-based organic materials having low density in comparison to alloys and ceramic are generally used due to the characteristics of the materials, so the thermoelectric modules may be relatively light.

In addition, according to the thermoelectric module apparatus of the present invention, since the flexible thermoelectric modules are inserted in the housing, the apparatus can be easily added to or removed from the exhaust pipes of the internal combustion engines of the related art. That is, since the thermoelectric modules are soft and an exhaust pipe can be easily inserted, they can be operated only by being installed on an exhaust pipe. Accordingly, the apparatus can be applied to all of new internal combustion engines, other than the internal combustion engines of the related art, so it can be more widely used.

Further, according to the thermoelectric module apparatus of the present invention, since the thermoelectric plates are connected in series by the connecting terminals, high yield of power can be achieved.

Further, according to the thermoelectric module apparatus of the present invention, moving terminals for connecting the connecting terminals are provided, the thermoelectric modules can be selectively connected in parallel and in series. That is, series connection can provide high power, while parallel connection can continuously generate and supply power even if the thermoelectric plates and the thermoelectric modules are partially damaged.

Further, the thermoelectric module apparatus according to an embodiment of the present invention includes caps coupled to longitudinal ends of the heat sink, the caps can turn about the heat sink, and the moving terminals are disposed inside the caps, so the parallel connection mode and the series connection mode can be easily changed, and accordingly, efficiency of generating power can be improved.

While the present invention has been illustrated and described in connection with the exemplary embodiments, it will be apparent to those skilled in the art that modifications and variations can be made without departing from the spirit and scope of the invention as defined by the appended claims.

What is claimed is:

1. A thermoelectric module apparatus comprising:
    a pipe-shaped housing having a hole longitudinally formed inside the housing and a plurality of mount holes arranged in parallel with each other in a circumferential direction of the housing;
    a thermoelectric module coupled to the housing and having a plurality of thermoelectric plates each fit in each of the plurality of mount holes, each thermoelectric plate having a first end located inside the housing and a second end located outside the housing;
    heat sinks combined with the thermoelectric module, each heat sink being located outside the housing a plurality of and coupled to the second end of each thermoelectric module;
    a plurality of connecting terminals disposed between the thermoelectric plates respectively and connect the thermoelectric plates in series; and
    a plurality of moving terminals that is movable on the housing and change positions between a first position and a second position to connect or disconnect two adjacent connecting terminals such that the thermoelectric plates are connected in parallel or in series.

2. The apparatus of claim 1, wherein each of the thermoelectric plates are arranged in a radial direction of the housing toward a center of the housing.

3. The apparatus of claim 1, further comprising an exhaust pipe coaxially positioned in the hole of the housing, wherein the first end of each thermoelectric plates is in contact with an outer surface of the exhaust pipe.

4. The apparatus of claim 1, wherein each thermoelectric plate is made of a flexible material which is bendable.

5. The apparatus of claim 1, wherein each heat sink includes a coupling hole and the second end of each thermoelectric plate is fit in the coupling hole.

6. The apparatus of claim 5, further comprising coating films made of a polymer,
    wherein each coating film is inserted in the coupling hole of each heat sink and positioned at the second end of each thermoelectric plate outside the housing.

7. The apparatus of claim 5, wherein each of the heat sinks has a plurality of ridges and corrugations.

8. The apparatus of claim 1, wherein each of the connecting terminals extends along an outer circumference of the housing and connects two adjacent thermoelectric plates to each other.

9. The apparatus of claim 8, wherein the connecting terminals include a plurality of first connecting terminals and a plurality of second connecting terminals,
    each of the first connecting terminals connects upper ends of two adjacent thermoelectric plates,
    each of the second connecting terminals connects lower ends of two adjacent thermoelectric plates, and
    the thermoelectric plates are connected in series by the first connecting terminals and the second connecting terminals.

10. The apparatus of claim 9, wherein the moving terminals connect the two adjacent connecting terminals at the first position such that the thermoelectric plates are connected in parallel by the moving terminals and the connecting terminals in a parallel connection mode, and disconnect the two adjacent connecting terminals at the second position such that the thermoelectric plates are connected in series by the connecting terminals in a series connection mode.

11. The apparatus of claim 1, wherein the moving terminals include a plurality of first moving terminals and a plurality of second moving terminals, and
    each of the first moving terminals connects two adjacent first connecting terminals at the first position and each of the second moving terminals connects two adjacent second connecting terminals at the first position, such that the thermoelectric plates are connected in parallel by the first and second moving terminals at the first position and the connecting terminals.

12. The apparatus of claim 11, each of the first moving terminals disconnects the two adjacent first connecting terminals at the second position and each of the second moving terminals disconnects the two adjacent second connecting terminals at the second position, such that the thermoelectric plates are connected in series by the connecting terminals.

13. The apparatus of claim 1, further comprising caps coupled to open ends of the housing,
    wherein the caps are detachably coupled to the housing.

14. The apparatus of claim 13, wherein the caps are disposed rotatably in the circumferential direction of the housing, and
    the moving terminals are disposed inside the caps such that the moving terminals move between the first position and the second position according to a rotation of the caps.

15. The apparatus of claim 1, wherein the housing is made of a flexible material in a plate shape and the flexible material is shaped into a cylindrical shape by rolling the flexible material and connecting ends of the flexible material to each other.

16. The apparatus of claim 1, wherein the housing includes two parts connected by a hinge and locked by a locking device.

* * * * *